United States Patent
Nemazie et al.

(10) Patent No.: US 8,886,911 B2
(45) Date of Patent: Nov. 11, 2014

(54) DYNAMIC MEMORY CACHE SIZE ADJUSTMENT IN A MEMORY DEVICE

(75) Inventors: Siamack Nemazie, Los Altos, CA (US); Farshid Tabrizi, San Jose, CA (US); Berhanu Iman, Sunnyvale, CA (US); Ruchir Shah, San Jose, CA (US); William E. Benson, San Mateo, CA (US); Michael George, Pleasanton, CA (US)

(73) Assignee: Micron Technology, Inc., Boise, ID (US)

( * ) Notice: Subject to any disclaimer, the term of this patent is extended or adjusted under 35 U.S.C. 154(b) by 352 days.

(21) Appl. No.: 13/118,721

(22) Filed: May 31, 2011

(65) Prior Publication Data

US 2012/0311293 A1    Dec. 6, 2012

(51) Int. Cl.
| | | |
|---|---|---|
| *G06F 12/00* | (2006.01) | |
| *G06F 12/08* | (2006.01) | |
| *G11C 16/04* | (2006.01) | |
| *G11C 11/56* | (2006.01) | |
| *G11C 16/06* | (2006.01) | |

(52) U.S. Cl.
CPC ........ *G06F 12/0893* (2013.01); *G11C 11/5628* (2013.01); *G11C 16/06* (2013.01); *G11C 16/0483* (2013.01)
USPC ..... 711/171; 711/129; 711/173; 711/E12.002

(58) Field of Classification Search
None
See application file for complete search history.

(56) References Cited

U.S. PATENT DOCUMENTS

| | | | |
|---|---|---|---|
| 8,479,080 B1 * | 7/2013 | Shalvi et al. | 714/774 |
| 2007/0174551 A1 * | 7/2007 | Cornwell et al. | 711/118 |
| 2007/0283081 A1 * | 12/2007 | Lasser | 711/103 |
| 2009/0313423 A1 | 12/2009 | Byeon | |
| 2009/0327590 A1 | 12/2009 | Moshayedi | |
| 2010/0017556 A1 | 1/2010 | Chin et al. | |
| 2010/0122016 A1 * | 5/2010 | Marotta et al. | 711/103 |
| 2010/0172179 A1 * | 7/2010 | Gorobets et al. | 365/185.09 |
| 2010/0174847 A1 * | 7/2010 | Paley et al. | 711/103 |
| 2010/0332922 A1 * | 12/2010 | Chang et al. | 714/704 |
| 2011/0107042 A1 * | 5/2011 | Herron | 711/161 |
| 2011/0208896 A1 * | 8/2011 | Wakrat et al. | 711/103 |
| 2011/0252187 A1 * | 10/2011 | Segal et al. | 711/103 |
| 2011/0271043 A1 * | 11/2011 | Segal et al. | 711/103 |

OTHER PUBLICATIONS

M. Saxena and M. M. Swift. FlashVM: virtual memory management on flash. In Proc. of 2010 USENIX conference on annual technical conference (USENIX ATC '10), 2010.*

(Continued)

*Primary Examiner* — Christian P Chace
*Assistant Examiner* — Brendan Lillis
(74) *Attorney, Agent, or Firm* — Dicke, Billig & Czaja, PLLC (57) ABSTRACT

Methods for dynamic memory cache size adjustment, enabling dynamic memory cache size adjustment, memory devices, and memory systems are disclosed. One such method for dynamic memory cache size adjustment determines available memory space in a memory array and adjusts a size of a memory cache in the memory array responsive to the available memory space.

26 Claims, 5 Drawing Sheets

(56) References Cited

OTHER PUBLICATIONS

Sang-Hoon Kim, Jin-Soo Kim, and Seungryoul Maeng, "Using Solid State Drives (SSDs) for Virtual Block Devices," Proceedings of the Second Workshop on Runtime Environments, Systems, Layering and Virtualized Environments (RESoLVE 2012) (co-located with ASPLOS 2012), London, United Kingdom, Mar. 2012.*
International Search Report for International Application No. PCT/US2012/036923 dated Dec. 12, 2012, 3 pages.*
International Written Opinion for International Application No. PCT/US2012/036923 dated Dec. 2, 2013, 5 pages.*
T. Kgil, et al. "Improving NAND Flash Based Disk Caches," International Symposium on Computer Architecture, Copyright 2008 IEEE, pp. 327-338.
D. Roberts, et al. "Integrating NAND Flash Devices onto Servers," Communications of the ACM, Apr. 2009, vol. 52, No. 4, pp. 98-106.
S. Hong, et al. "NAND Flash-based Disk Cache Using SLC/MLC Combined Flash Memory," 2010 International Workshop on Storage Network Architecture and Parallel I/O's, Copyright 2010 IEEE, pp. 21-30.

* cited by examiner

DYNAMIC MEMORY CACHE SIZE ADJUSTMENT IN A MEMORY DEVICE

TECHNICAL FIELD

The present embodiments relate generally to memory and a particular embodiment relates to dynamic SLC cache in an MLC memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased on a block-by-block basis (and reprogrammed on a page-by-page basis). Changes in a threshold voltage of each of the memory cells, through erasing or programming of a charge storage structure (e.g., floating gate or charge trap) or other physical phenomena (e.g., phase change or polarization), determine the data value programmed into each cell. The data in a cell of this type is determined by the presence or absence of the charge in the charge storage structure.

A programming operation typically comprises a series of incrementally increasing programming pulses that are applied to a control gate of a memory cell being programmed in order to increase that particular memory cell's threshold voltage. Each memory cell can be programmed as single level cell (SLC) memory or multiple level cell (MLC) memory where the cell's threshold voltage ($V_t$) is indicative of the data value programmed into that cell. For example, in an SLC memory, a $V_t$ of 2.5V might indicate a programmed cell while a $V_t$ of −0.5V might indicate an erased cell. An MLC memory uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

During programming of a block of memory cells, a fixed cache of memory cells is typically used to temporarily store data that is to be programmed into the block of memory cells. For example, in an MLC memory device, a fixed size SLC cache can be used to store data for programming into an MLC block of memory cells. This can improve memory reliability. The memory performance is also improved prior to the cache becoming near full, at that point part of the cache must be moved to MLC blocks to create more room in the cache, and the performance advantage of the cache will be diminished. The performance improvement is function of the size of the cache but has the drawback of reducing user capacity since a fixed portion of the memory is used as a SLC cache and cannot be used to store user data with the same efficiency as MLC.

For the reasons stated above and for other reasons that will become apparent to those skilled in the art upon reading and understanding the present specification, there is a need in the art for a more efficient way to temporarily store data during programming.

DETAILED DESCRIPTION

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 1:
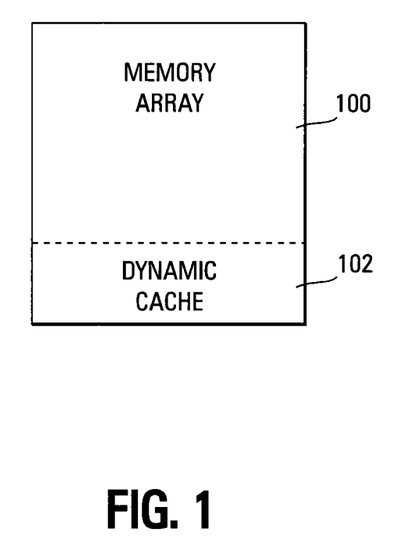
FIG. 1 shows a block diagram of one embodiment of a memory array in a memory device that incorporates a memory cache.

FIG. 1 illustrates a block diagram of one embodiment of memory array 100 of a memory device that incorporated dynamic memory cache 102. The memory array 100 is partitioned and includes a first partition; herein after referred to as main MLC memory wherein cells in that partition are programmed in MLC mode and a second partition 102 herein after referred to as dynamic SLC memory cache wherein cells in that partition are programmed in SLC mode. In one embodiment the blocks allocated to main memory in the memory array 100 are used as MLC and the blocks allocated to dynamic memory cache 102 are used as SLC. In a dynamic memory cache the allocation of blocks changes dynamically and is not fixed, a block may remain MLC or SLC or switch between being used as MLC or SLC. Without loss of generality, the blocks used for the cache 102 are referred to as SLC cache blocks and the blocks used for storing user data are referred to as MLC main memory blocks.

Typical prior art memory caches are fixed in size and are always enabled so that a portion of the memory array is always dedicated to a temporary data cache, reducing the amount of memory available for storing user data. The dynamic data cache 102 of FIG. 1 is adjusted in size dynamically, depending on the free space available, and may not always be enabled. Thus, the dynamic memory cache 102 can be adjusted such that it does not take up more memory than is necessary to accomplish the cache function wherein the cache size is dynamically adjusted. Another feature of present invention is that partition of memory to MLC and SLC can be at array or block level. Yet another feature of present invention is that the arrays or blocks in a partition are not required to be continuous. In some systems the data is always first written to cache. In other systems only some type of data is written to cache, for example data less than a page size. In systems with fixed or dynamic memory cache some events will trigger moving the valid data from the cache to the main memory blocks (in some systems both valid and invalid data in the cache may be moved). Such events include the number of free blocks in cache falling below a threshold. When a block in cache is moved to main memory the block is erased and it is reclaimed. Similarly, blocks in main memory containing old and new data can be reclaimed by moving the new data to another block in main memory and then erasing the old block.

The dynamic SLC memory cache 102 uses a variable number of blocks of memory of the memory array 100 to temporarily store data that is to be programmed into the main memory array 100. For example, the dynamic SLC memory cache 102 can store all pages (lower and upper) of data until the upper page of data is successfully programmed in the main MLC memory array 100. This can reduce corruption of a previously programmed lower page of the main MLC memory array 100 if a power failure occurs during upper page programming. In one embodiment, data is stored in the dynamic memory cache 102 blocks in SLC and when all pages required for programming a page in an MLC block are available (in dynamic memory cache 102) then the data is moved to a block in main memory array 100, so that the cache 102 can store all pages of data required until one page of the MLC main memory array 100 is programmed. For example, the SLC dynamic memory cache 102 can store a lower page of data until an upper page of the MLC main memory array 100 is successfully programmed. This can reduce corruption of a previously programmed lower page of the MLC main memory array 100 if a power failure occurs during upper page programming.

Figure 2:
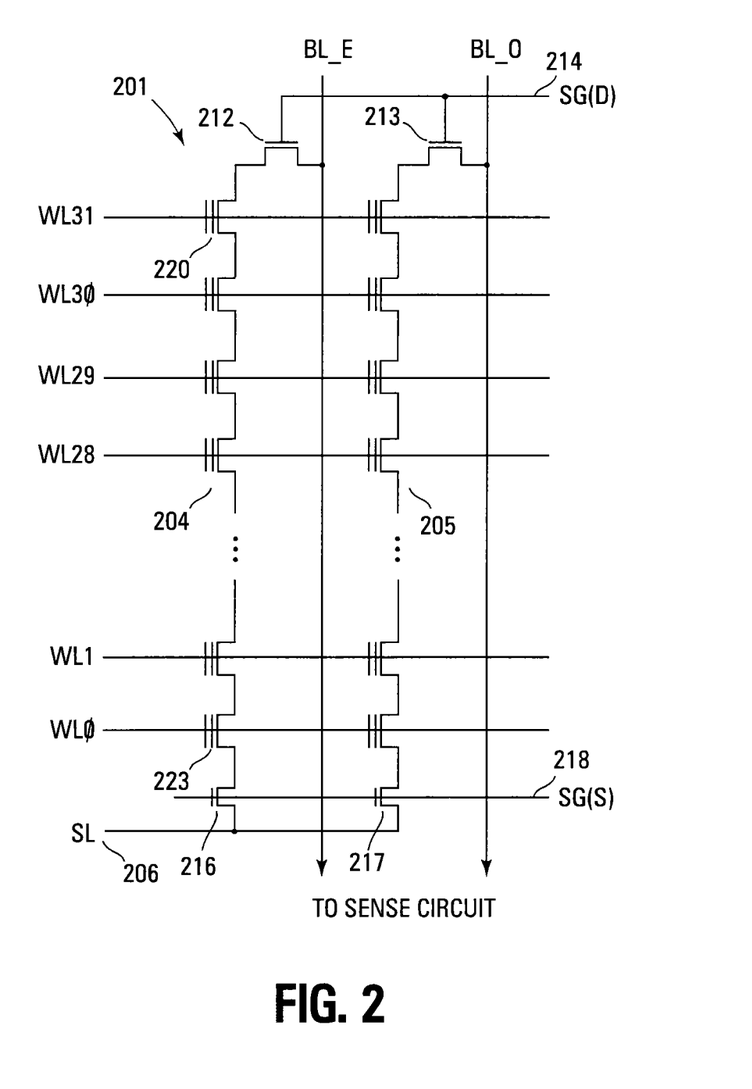
FIG. 2 shows a schematic diagram of one embodiment of a portion of a memory array in accordance with the block diagram of FIG. 1.

FIG. 2 illustrates a schematic diagram of one embodiment of a portion of the NAND architecture memory array 201, as illustrated in FIG. 1, comprising series strings of non-volatile memory cells. The present embodiments of the memory array are not limited to the illustrated NAND architecture. Alternate embodiments can use NOR or other architectures as well.

The memory array 201 comprises an array of non-volatile memory cells (e.g., floating gate) arranged in columns such as series strings 204, 205. Each of the cells is coupled drain to source in each series string 204, 205. An access line (e.g. word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually coupled to sense circuitry that detect the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

Figure 3:
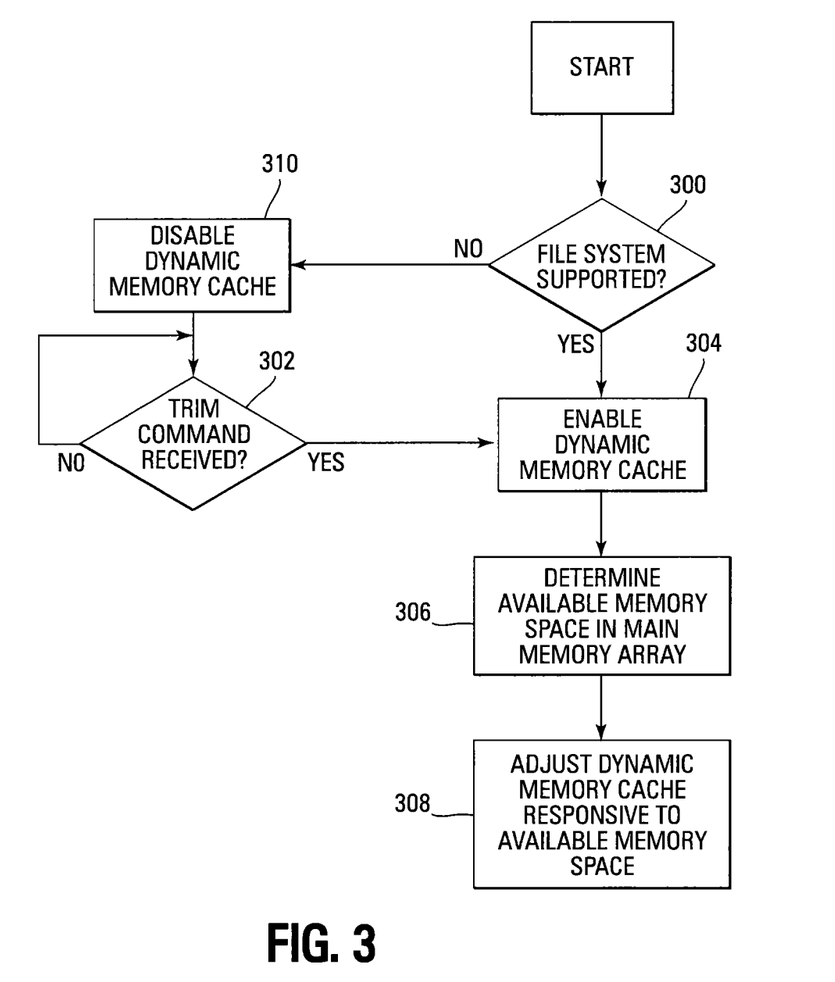
FIG. 3 shows flow chart of one embodiment of a method for dynamic cache size adjustment.

FIG. 3 illustrates a flow chart of one embodiment of a method for dynamically adjusting the size of the dynamic memory cache illustrated in FIG. 1. Since some file systems might not be recognized, the method determines if the file system implemented (e.g., installed, executed) on the memory device is one that is supported 300. As is well known in the art, a file system (e.g., File Allocation Table (FAT), New Technology File System (NTFS)) is a method for storing and organizing computer files and their data. It organizes these files into a database for the storage, organization, manipulation, and retrieval by a computer's operating system.

If the file system does not support dynamic cache size adjustment 300, the dynamic memory cache adjustment is disabled 310. Dynamic memory cache size adjustment might still be implemented if the memory device supports any command protocol that allows deletion of ranges of logical block addresses in order to implement the dynamic changing of the memory cache size. One such protocol known in the art is typically generically referred to as a TRIM protocol. It is thus determined if a TRIM command has been received 302. This step 302 is repeated until the TRIM command is received. Once the TRIM command is received 302, the dynamic memory cache is enabled 304.

Since the size of the dynamic memory cache is adjusted in response to the available memory space in the main memory array, the available memory space in the main memory array is determined 306. The amount of available memory space can change constantly. In one embodiment, the amount of available memory space in the main memory array can be determined after every write or erase operation. In other embodiments, the amount of available memory space can be determined periodically or at random times. Available memory space can include both erased memory that is not targeted for immediate use as well as memory that has not yet been erased but the data stored in the memory is old and no longer valid. In yet another embodiment, the amount of available memory is adjusted in response to a received TRIM command (if TRIM is supported) or, in case of known file systems, when clusters are deallocated or written.

In systems with fixed or dynamic memory cache, some events will trigger moving the valid data (or, optionally, valid and invalid data) from the dynamic SLC cache memory to the main MLC memory blocks. Such events include the number of free blocks in cache falling below a threshold. When a block in dynamic SLC cache is moved to main MLC memory the block is erased and it is reclaimed and added to the pool of free blocks. Similarly, blocks in main MLC memory containing old and new data can be reclaimed by moving only the valid data to another block in main MLC memory and then erasing the old block.

The size of the dynamic memory cache is then adjusted in response to the available memory space 308. The size of the dynamic memory cache can be a percentage of the available memory space, all of the available memory space, or a certain number of blocks of the available memory space. In one embodiment, the percentage of the available memory space used can also be dynamically changed. For example, only 50% of the available memory space might be allocated to the dynamic memory cache at one time and, at a later time, 90% of the available memory space might be allocated to the dynamic memory cache. Such dynamic allocation of the percentage of available memory space can be performed as often as desired.

Figure 4:
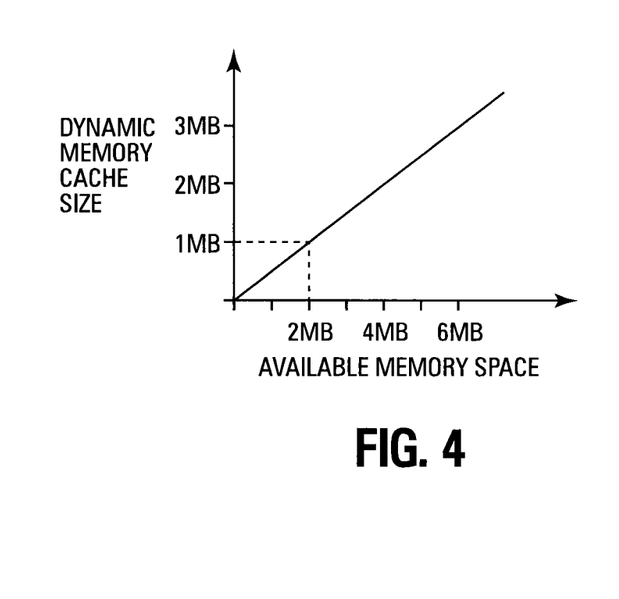
FIG. 4 shows a plot of one embodiment of one function for determining when to adjust the cache size.

FIG. 4 illustrates a plot of one embodiment of a function that can be used to determine the amount of available memory space to allocate to the dynamic memory cache. This function is a linear ramped function in which a fixed percentage (e.g., 50%) of the available memory space is allocated to the dynamic memory cache.

This plot includes the available memory space along the x-axis and the size of the dynamic memory cache along the y-axis. The memory size values on both the x and y-axes, in this and the following embodiments, are for purposes of illustration only as the present embodiments are not limited to any certain values. The slope of the line determines the percentage of available memory space that is allocated to the dynamic memory cache. The illustrated example shows a 50% embodiment.

Figure 5:
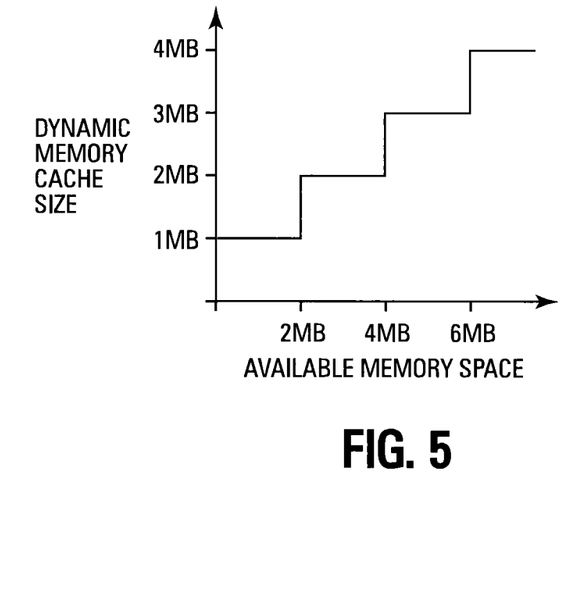
FIG. 5 shows a plot of another embodiment of a function for determining when to adjust the cache size.

FIG. 5 illustrates a plot of another embodiment of a function that can be used to determine the amount of available memory space to allocate to the dynamic memory cache. This function is a staircase function that can be used to reduce the frequency of dynamic memory cache size adjustment.

Changing dynamic memory cache sizes uses a particular amount of time to perform various clean-up tasks. For example, when a memory block that has been used as part of the dynamic memory cache is to be returned to the main memory array, the data in that memory block needs to be moved and the memory block erased. In one embodiment, the SLC memory block of the dynamic memory cache is reallocated as an MLC memory block. Additionally, memory address pointers and other memory housekeeping tasks should also be performed to reallocate a dynamic memory cache block. Thus, it is typically desirable to reduce the frequency of dynamic memory cache size changes.

The staircase function is one way of reducing the frequency of dynamic memory cache size changes. This can be seen in reference to the plot of FIG. 5. Unlike the embodiment of FIG. 4 where the size change is performed in response to the slope of the line, the change of cache size does not occur in the stair step function until the present step reaches another particular threshold of available memory space.

For example, the initial dynamic memory cache size of 1 MB does not change until the available memory space reaches the 2 MB threshold. Then the dynamic memory cache size is increased to 2 MB. The illustrated available memory space and dynamic memory cache sizes are for purposes of illustration only as different amounts of available memory space can trigger reallocating different amounts of memory to the dynamic memory cache. Similarly, alternate embodiments of the step function illustrated in FIG. 5 can remain at the same dynamic memory cache size longer and/or allocate greater amounts of memory to the dynamic memory cache each time a threshold is reached.

In yet another embodiment of a function for determining the amount of available memory space to allocate to the dynamic memory cache, the cache size can be a function of if the amount of unused available memory is increasing or decreasing over a particular time period. For example, instead of a fixed percentage as illustrated in FIG. 4, if the available memory space size is increasing over a particular time period, the function might allocate a greater percentage of memory to the dynamic memory cache size than if the available memory space size was decreasing over the particular time period. In another embodiment, if the available memory space size is decreasing over a particular time period, the function might allocate a smaller percentage of memory to the dynamic memory cache size.

In yet another embodiment, to minimize overhead and dynamically allocating most of free space to cache a common pool of free (erased) blocks is used for both dynamic SLC cache and main MLC memory. As free blocks are required (that is the number of free block fall below a first "start" threshold) dynamic SLC cache blocks are reclaimed and added to free pool until the number of free blocks is equal or more than a second "stop" threshold. The start and stop threshold may be adjusted dynamically. For example during foreground that is execution of command from host where we want to minimize reclaiming dynamic SLC cache blocks the stop threshold will not be high, but in background where there is no host commands the stop threshold will be set higher.

In one embodiment, the memory blocks that are allocated as dynamic memory cache blocks are contiguous memory blocks. In another embodiment, the dynamic memory cache blocks are not contiguous. In such an embodiment, a bit map can be used to indicate and track which memory blocks are used as dynamic memory cache blocks. In another embodiment, the bit indicating SLC or MLC may be combined with other information in the table for Logical to Physical mapping. In another embodiment, a list can be maintained for both SLC and MLC blocks. Such a list is typically a linked list for ease of implementation. In another embodiment the bit indicating SLC or MLC may be combined with other information in the table for Logical to Physical mapping. In another embodiment, a list is additionally maintained for both SLC and MLC blocks. Such a list is typically a linked list for ease of implementation.

Figure 6:
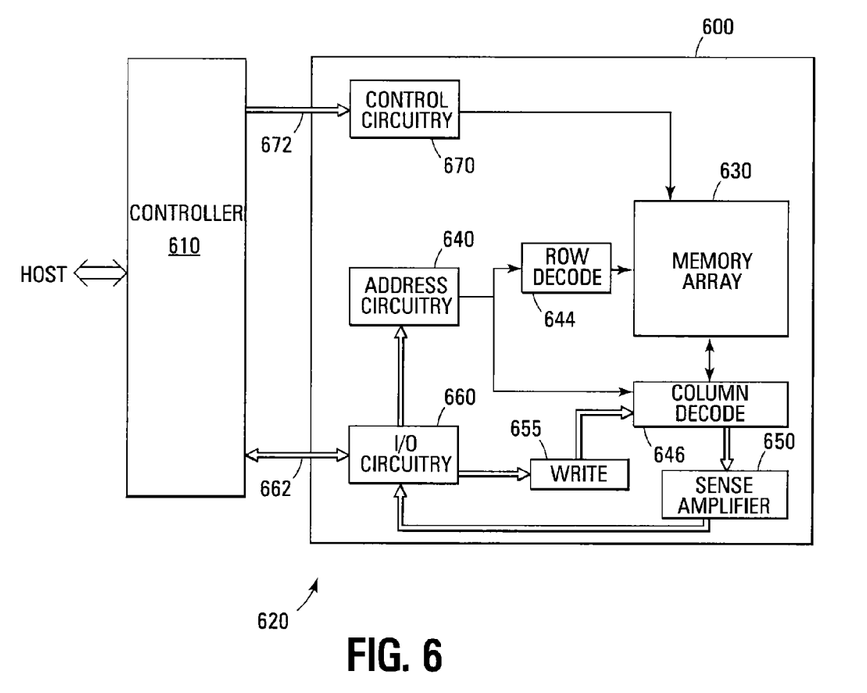
FIG. 6 shows a block diagram of one embodiment of a memory system.

FIG. 6 illustrates a functional block diagram of a memory device 600. The memory device 600 is coupled to an external controller 610. The controller 610 may be a microprocessor or some other type of controller. The memory device 600 and the controller 610 form part of a memory system 620. The controller 610 can be coupled to a host and the controller 610 can be responsive to commands from the host.

The memory device 600 includes an array 630 of memory cells (e.g., non-volatile memory cells). The memory array 630 is arranged in banks of word line rows and bit line columns. In one embodiment, the columns of the memory array 630 comprise series strings of memory cells.

Address buffer circuitry 640 is provided to latch address signals provided through I/O circuitry 660. Address signals are received and decoded by a row decoder 644 and a column decoder 646 to access the memory array 630.

The memory device 600 reads data in the memory array 630 by sensing voltage or current changes in the memory array columns using sense amplifier circuitry 650. The sense amplifier circuitry 650, in one embodiment, is coupled to read and latch a row of data from the memory array 630. Data input and output buffer circuitry 660 is included for bidirectional data communication as well as the address communication over a plurality of data connections 662 with the controller 610. Write circuitry 655 is provided to write data to the memory array.

Memory control circuitry 670 decodes signals provided on control connections 672 from the controller 610. These signals are used to control the operations on the memory array 630, including data read, data write (program), and erase operations. The memory control circuitry 670 may be a state machine, a sequencer, or some other type of controller to generate the memory control signals. In one embodiment, the memory control circuitry 670 and/or the external controller 610 are configured to control execution of the dynamic memory cache size adjustment.

The memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments of the method for dynamic memory cache size adjustment can provide increased capacity, performance (read or write) and/or reliability for user data in a memory device by dynamically adjusting the amount of memory allocated to a memory cache (e.g., used as SLC).

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for dynamic memory cache size adjustment, the method comprising:
   disabling dynamic adjustment of a physical size of a memory cache of a memory device in response to determining that a file system on the memory device does not support dynamic cache size adjustment;
   enabling the disabled dynamic adjustment of the physical size of the memory cache in response to determining that the memory device supports a command that allows for the dynamic adjustment of the physical size of the memory cache;
   determining a size of available memory space in a memory array of the memory device; and
   adjusting the physical size of a memory cache in the memory array responsive to the determined size of available memory space.

2. The method of claim 1 wherein the available memory space is one of erased memory that is not targeted for use or unerased memory that stores data that is not valid.

3. The method of claim 1 wherein the physical size of the memory cache is a percentage of the determined size of available memory space.

4. The method of claim 3 and further including dynamically adjusting the percentage.

5. The method of claim 3 wherein the percentage of the determined size of available memory space is a fixed percentage of the determined size of available memory space.

6. The method of claim 3 wherein the percentage of the determined size of available memory space is a variable percentage of the determined size of available memory space.

7. The method of claim 6 wherein the variable percentage of the determined size of available memory space increases when the determined size of available memory space increases over a particular time period.

8. The method of claim 6 wherein the variable percentage of the determined size of available memory space decreases when the determined size of available memory space decreases over a particular time period.

9. The method of claim 1 wherein adjusting the physical size comprises allocating a first number of blocks of the memory array for use as the memory cache and allocating a second number of blocks of the memory array for use as main memory.

10. The method of claim 9 wherein allocating the first number of blocks includes allocating a block previously allocated for use as part of the main memory for use as part of the memory cache.

11. The method of claim 9 wherein memory cells in a block allocated for use as part of the main memory are programmed as MLC cells, and wherein memory cells in a block allocated for use as part of the memory cache are programmed as SLC cells.

12. The method of claim 9 wherein allocating a block previously allocated for use as part of the main memory for use as part of the memory cache comprises switching between programming memory cells of the block as MLC cells to programming the memory cells of the block as SLC cells.

13. A method for enabling dynamic memory cache size adjustment, the method comprising:
   determining that a file system that is installed on a memory device does not support dynamic adjustment of a physical size of a memory cache of the memory device;
   disabling the dynamic adjustment of the physical size of the memory cache in response to determining that the file system installed on the memory device does not support the dynamic adjustment of the physical size of the memory cache; and
   enabling the disabled dynamic adjustment of the physical size of the memory cache in response to determining that the memory device supports a command that allows for the dynamic adjustment of the physical size of the memory cache regardless of the file system not supporting dynamic adjustment of the physical size of the memory cache.

14. The method of claim 13 wherein determining if the memory device supports the particular file system comprises determining if a command is received that supports a protocol that allows deletion of a range of logical block addresses.

15. A method for dynamic memory cache size adjustment in a memory device, the method comprising:
   disabling dynamic adjustment of a physical size of a memory cache in a memory array of the memory device in response to determining that a file system implemented on the memory device does not support dynamic cache size adjustment;
   enabling the disabled dynamic adjustment of the physical size of the memory cache in response to determining that the memory device supports a command that allows for deletion of a range of logical block addresses of the memory device;
   determining a size of available memory space in the memory array of the memory device in response to enabling the disabled dynamic adjustment of the physical size of the memory cache; and
   adjusting the physical size of the memory cache responsive to the determined size of available memory space.

16. The method of claim 15 wherein adjusting the physical size of the memory cache comprises adjusting the physical size of the memory cache linearly responsive to the determined size of available memory space.

17. The method of claim 15 wherein adjusting the physical size of the memory cache comprises adjusting the physical size of the memory cache as a step function of the determined size of available memory space.

18. The method of claim 15 wherein the physical size of the memory cache is adjusted when the determined size of available memory reaches each of a plurality of available memory thresholds.

19. A memory device comprising:
   an array of memory cells comprising a memory cache;
   memory control circuitry coupled to the array of memory cells; and
   a file system;
   wherein the control circuitry is configured to disable dynamic adjustment of a physical size of the memory cache in response to determining that the file system does not support dynamic cache size adjustment;
   wherein the control circuitry is configured to enable the disabled dynamic adjustment of the physical size of the memory cache in response to determining that the memory device supports a command that allows for the dynamic adjustment of the physical size of the memory cache; and
   wherein the control circuitry is configured to determine a size of available memory in the array of memory cells and adjust the physical size of the memory cache responsive to the determined size of available memory.

20. The memory device of claim 19 wherein adjusting the physical size of the memory cache comprises adjusting a number of blocks of the array whose memory cells are programmed as SLC cells.

21. The memory device of claim 19 wherein the array of memory cells comprise one of a NAND or a NOR architecture.

22. The memory device of claim 19 wherein the memory control circuitry is configured to adjust the physical size of the memory cache dynamically as a function of whether the determined size of available memory is increasing or decreasing over a particular time period.

23. A memory system comprising:
a memory device and a controller configured to implement a file system on the memory device, wherein the memory device comprises:
an array of memory cells comprising a memory cache;
wherein the controller is configured to determine if the file system supports dynamic adjustment of a physical size of the memory cache, wherein the controller is further configured to disable the dynamic adjustment of the physical size of the memory cache in response to determining that the file system does not support dynamic adjustment of the physical size of the memory cache, and wherein the controller is further configured to enable the disabled dynamic adjustment of the physical size of the memory cache, regardless of the file system not supporting dynamic adjustment of the physical size of the memory cache, in response to determining that the memory device supports a command that allows for the dynamic adjustment of the physical size of the memory cache.

24. The memory system of claim 23 wherein the array of memory cells comprises non-volatile memory cells.

25. The memory system of claim 23 wherein the controller is configured to increase the physical size of the memory cache responsive to a size of available memory reaching one of a plurality of available memory thresholds.

26. The memory system of claim 25 wherein the plurality of available memory thresholds forms a step function of the size of available memory.

* * * * *